(12) United States Patent
Heppner et al.

(10) Patent No.: US 9,728,425 B1
(45) Date of Patent: Aug. 8, 2017

(54) SPACE-EFFICIENT UNDERFILLING TECHNIQUES FOR ELECTRONIC ASSEMBLIES

(71) Applicant: INTEL CORPORATION, Santa Clara, CA (US)

(72) Inventors: Joshua D. Heppner, Chandler, AZ (US); Serge Roux, Gilbert, AZ (US); Michael J. Baker, Gilbert, AZ (US); Javier A. Falcon, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/089,491

(22) Filed: Apr. 2, 2016

(51) Int. Cl.
| | |
|---|---|
| *H01L 21/56* | (2006.01) |
| *H01L 21/67* | (2006.01) |
| *B29C 35/08* | (2006.01) |
| *B29C 70/84* | (2006.01) |
| *B29C 70/80* | (2006.01) |
| *B29C 70/88* | (2006.01) |
| *H01L 23/31* | (2006.01) |
| *B29K 63/00* | (2006.01) |
| *B29L 31/34* | (2006.01) |

(52) U.S. Cl.
CPC ........ *H01L 21/563* (2013.01); *B29C 35/0805* (2013.01); *B29C 70/80* (2013.01); *B29C 70/84* (2013.01); *B29C 70/882* (2013.01); *H01L 21/67126* (2013.01); *H01L 23/3157* (2013.01); *B29C 2035/0822* (2013.01); *B29C 2035/0827* (2013.01); *B29K 2063/00* (2013.01); *B29K 2995/0005* (2013.01); *B29L 2031/3481* (2013.01)

(58) Field of Classification Search
CPC ...... H01L 21/4814; H01L 23/18; H01L 25/04
See application file for complete search history.

(56) References Cited

U.S. PATENT DOCUMENTS

| | | | | |
|---|---|---|---|---|
| 2013/0105975 | A1* | 5/2013 | Hussain ................ | H01L 21/563 257/741 |
| 2013/0187258 | A1* | 7/2013 | Lu ....................... | H01L 23/3135 257/621 |
| 2015/0303163 | A1* | 10/2015 | Chuang ................. | H01L 21/563 257/618 |

* cited by examiner

*Primary Examiner* — Cheung Lee

(57) ABSTRACT

Space-efficient underfilling techniques for electronic assemblies are described. According to some such techniques, an underfilling method may comprise mounting an electronic element on a surface of a substrate, dispensing an underfill material upon the surface of the substrate within a dispense region for forming an underfill for the electronic element, and projecting curing rays upon at least a portion of the dispensed underfill material to inhibit an outward flow of dispensed underfill material from the dispense region, and the underfill material may comprise a non-visible light (NVL)-curable material. Other embodiments are described and claimed.

17 Claims, 18 Drawing Sheets

Electronic Assembly 100

Electronic Assembly 100

*Dispense Assembly 600*

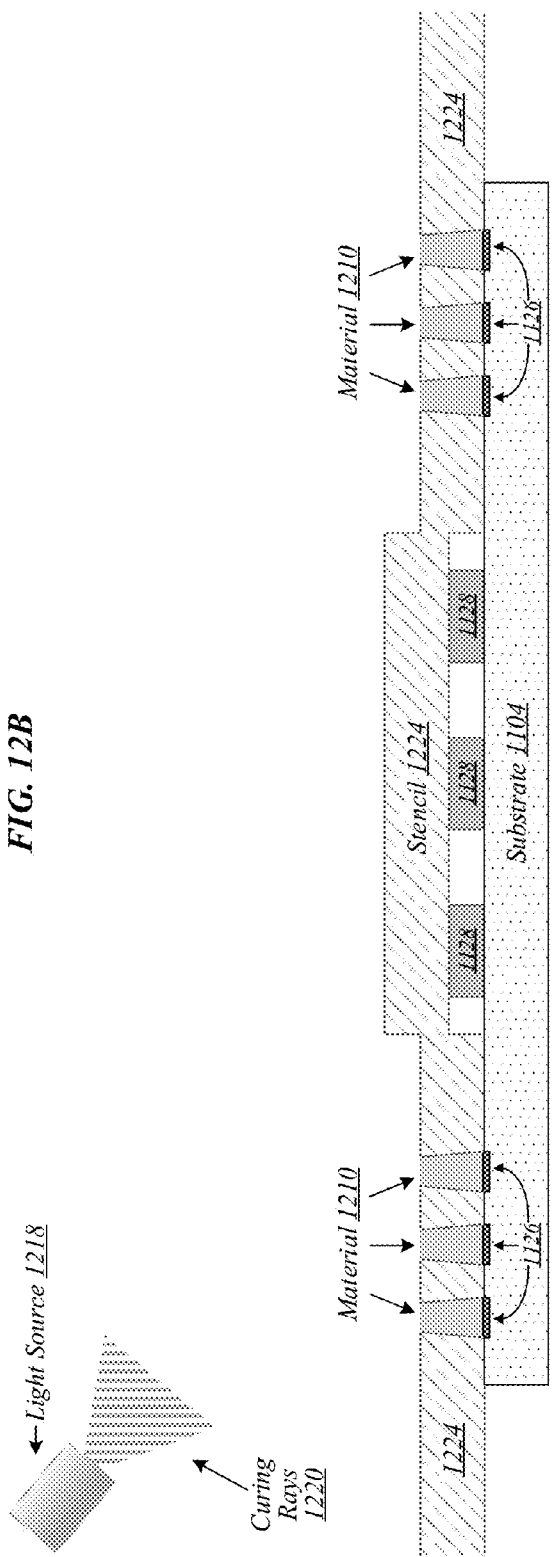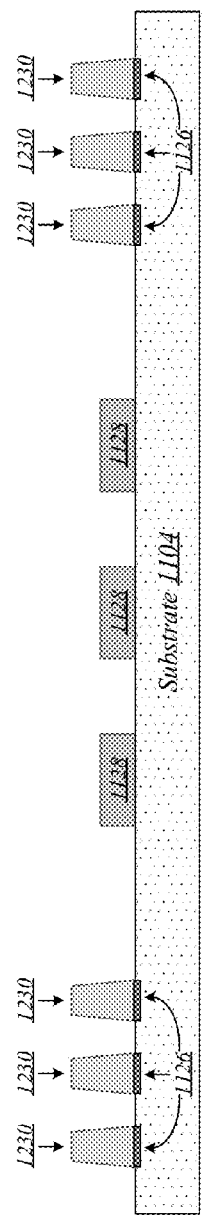
FIG. 12B
FIG. 12C

SPACE-EFFICIENT UNDERFILLING TECHNIQUES FOR ELECTRONIC ASSEMBLIES

TECHNICAL FIELD

Embodiments herein generally relate to electronic assemblies, such as electronic assemblies comprising electronic components mounted on printed circuit boards (PCBs).

BACKGROUND

Some types of connection arrangements for surface mounting electronic components to PCBs feature mounting connections of types that provide limited mechanical flexibility. For example, due to the rigidity of the solder balls of a ball grid array (BGA), even a relatively slight degree of bending may result in solder joint fracture. In order to safeguard against the potential for mechanical stress upon an assembly to bend or otherwise deform the substrate in such a way as to fracture mounting connections of a given component, an underfill material may be implanted in the region between that component and the substrate.

BRIEF DESCRIPTION OF THE DRAWINGS

FIG. 12B illustrates an embodiment of a second stage of the feature formation process.

FIG. 12C illustrates an embodiment of a third stage of the feature formation process.

DETAILED DESCRIPTION

Various embodiments may be generally directed to space-efficient underfilling techniques for electronic assemblies. According to some such techniques, an underfilling method may comprise mounting an electronic element on a surface of a substrate, dispensing an underfill material upon the surface of the substrate within a dispense region for forming an underfill for the electronic element, and projecting curing rays upon at least a portion of the dispensed underfill material to inhibit an outward flow of dispensed underfill material from the dispense region, and the underfill material may comprise a non-visible light (NVL)-curable material. Other embodiments are described and claimed.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Figure 1A:
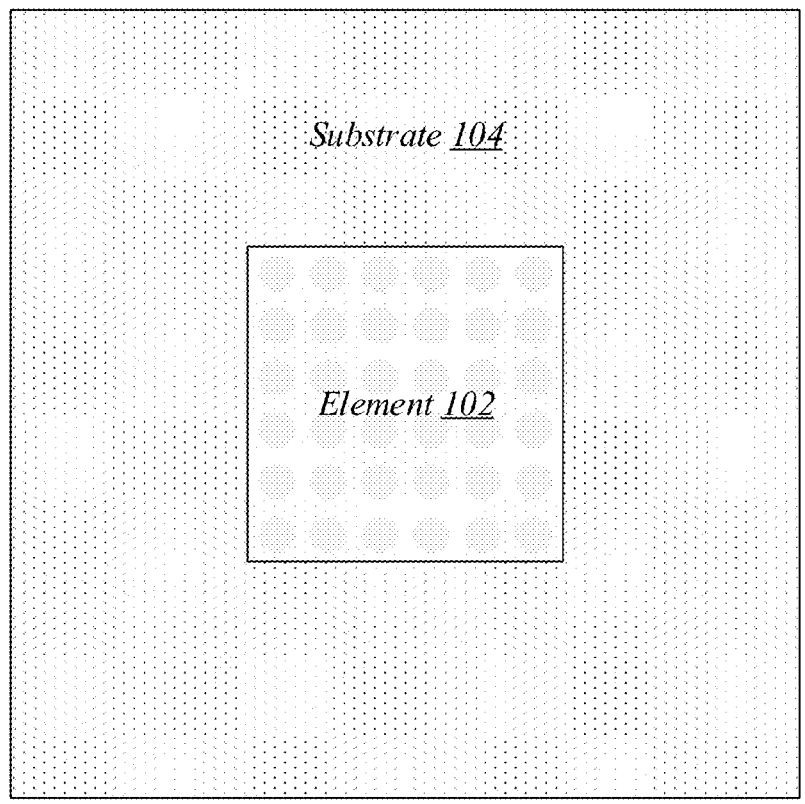
FIG. 1A illustrates an overhead view of a first electronic assembly.

FIG. 1A illustrates an overhead view of an electronic assembly 100. Electronic assembly 100 comprises an element 102 and a substrate 104, and element 102 is mounted on substrate 104. In various embodiments, element 102 may generally comprise an electronic element. In some embodiments, element 102 may comprise a silicon die, or another type of semiconductor die. In various embodiments, element 102 may comprise one or more integrated circuits (ICs). In some embodiments, such IC(s) may comprise processing circuitry. In various embodiments, such IC(s) may comprise radio frequency (RF) transceiver circuitry. In some embodiments, substrate 104 may comprise a printed circuit board (PCB). The embodiments are not limited to these examples.

Figure 1B:
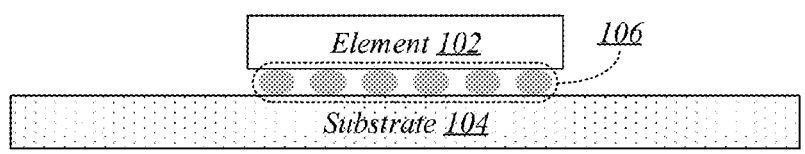
FIG. 1B illustrates a lateral view of the first electronic assembly.

FIG. 1B illustrates a lateral view of an electronic assembly 100. As shown in FIG. 1B, in various embodiments, element 102 may be mounted onto substrate 104 via a connection array 106. Connection array 106 may generally comprise a set of one or more connections that mechanically couple element 102 to substrate 104. In some embodiments, some or all of the connections of connection array 106 may comprise conductive connections that electronically couple conductive features of element 102 with conductive features of substrate 104. Examples of such conductive features according to various embodiments may include—without limitation—traces, tracks, vias, pads, lands, leads, and planes. In some embodiments, connection array 106 may comprise the various solder balls that may conductively connect an array of BGA pads on the surface of substrate 104 to a corresponding array of BGA pads on the bottom of element 102. The embodiments are not limited to this example.

In various embodiments, the nature of the connections in connection array 106 may constrain the degree to which electronic assembly 100 can flex in the vicinity of element 102 without fracturing one or more of the connections in connection array 106. For example, the acceptable flex in the vicinity of element 102 may be significantly limited in some embodiments in which connection array 106 comprises solder balls connecting BGA pads of element 102 to BGA pads of substrate 104. In various embodiments, in order to safeguard against the potential for mechanical stress upon electronic assembly 100 to bend or otherwise deform substrate 104 in such a way as to fracture connections of connection array 106, it may be desirable to implant an underfill material to fill unoccupied space between element 102 and the substrate 104.

Figure 2:
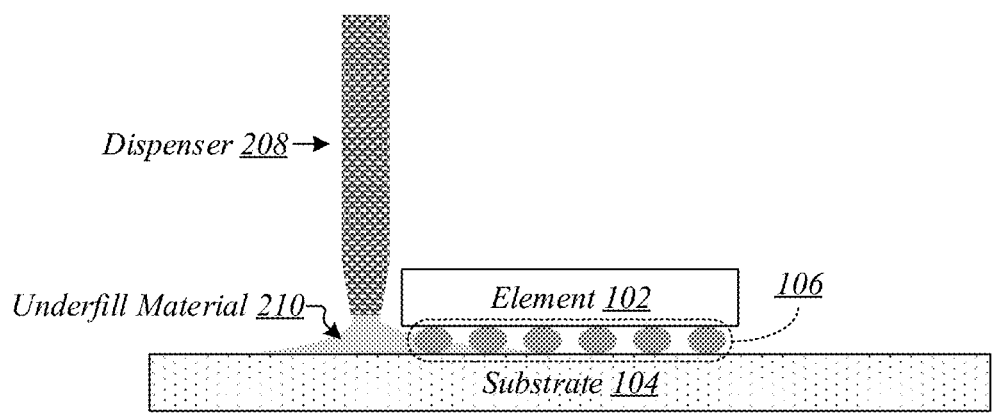
FIG. 2 illustrates an embodiment of a first underfilling process.

FIG. 2 illustrates an embodiment of an underfilling process according to which such an underfill may be formed according to some embodiments. According to the underfilling process of FIG. 2, a dispenser 208 may be used to dispense an underfill material 210 upon the surface of substrate 104. More particularly, in various embodiments, dispenser 208 may dispense underfill material 210 within a dispense region. In some embodiments, dispenser 208 may dispense underfill material 210 as dispenser 208 traverses a dispense path, which may generally comprise a path along some or all of the periphery of element 102. In such embodiments, the dispense region may comprise the peripheral regions within which the underfill material 210 is dispensed as dispenser 208 traverses the dispense path. In various embodiments, capillary action may draw dispensed underfill material 210 from the dispense region into the unoccupied space between element 102 and substrate 104. In this example, that unoccupied space may comprise the space not occupied by connections of connection array 106.

In some embodiments, underfill material 210 may generally comprise a material that remains substantially rigid or firm when heated to a maximum temperature expected to be observed in the vicinity of element 102 during ongoing operation. In various embodiments, in order to enable underfill material 210 to flow after being dispensed upon the surface of substrate 104, underfill material 210 may be heated prior to being dispensed. In some embodiments, heating underfill material 210 may cause it to transition from a firm or highly-viscous state to a less viscous state, which may increase its ability/tendency to flow into unoccupied space beneath element 102. In various embodiments, heating underfill material 210 may increase its tendency to be drawn into unoccupied space beneath element 102 by capillary action. In some embodiments, substrate 104 may also be heated in order to enhance the capillary action effect. The embodiments are not limited in this context.

Figure 3:
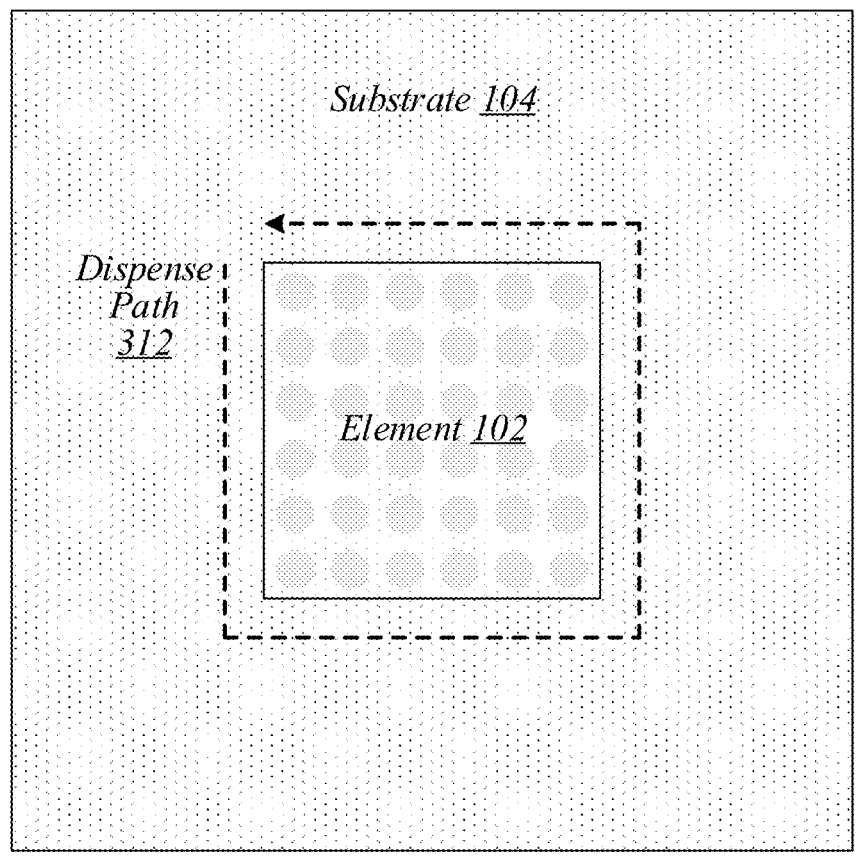
FIG. 3 illustrates an embodiment of a dispense path.

FIG. 3 illustrates an embodiment of a dispense path 312 that may be representative of a dispense path that may be traversed by dispenser 208 in various embodiments according to the underfilling process of FIG. 2. As shown in FIG. 3, dispense path 312 generally comprises a path along all four sides of element 102. If dispenser 208 of FIG. 2 is configured to dispense underfill material 210 while traversing dispense path 312, then the dispense region may generally comprise board space proximate to the four sides of element 102. It is to be appreciated that numerous dispense paths are both possible and contemplated, and the embodiments are not limited to this example. In some embodiments, an implemented dispense path may pass along a lesser number of sides of element 102, and/or may traverse a lesser portion of the periphery of element 102. In various embodiments, rather than comprising a continuous path, an implemented dispense path may comprise a set of two or more non-contiguous sub-paths. The embodiments are not limited in this context.

With respect to any given underfill process such as the underfill process of FIG. 2, the term "underfill region" may be used to collectively denote any space on the surface of substrate 104—other than that beneath element 102—that ultimately becomes coated with underfill material in conjunction with that underfill process. In some embodiments, while some dispensed underfill material 210 may flow into the unoccupied space beneath element 102, other dispensed underfill material 210 may tend to flow outwardly, away from element 102. In various embodiments, heating underfill material 210 to enable it to more easily flow into the unoccupied space beneath element 102 may increase the tendency for some dispensed underfill material 210 to flow outwardly, away from element 102, resulting in a larger underfill region.

Figure 4:
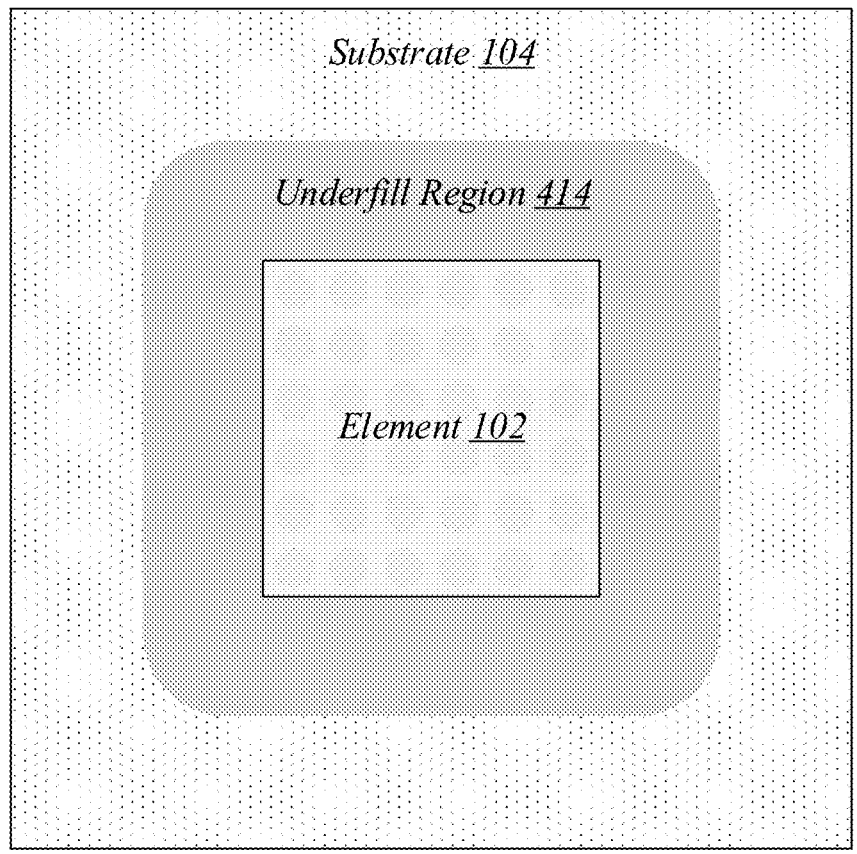
FIG. 4 illustrates an embodiment of a first underfill region.

FIG. 4 illustrates an underfill region 414 that may be representative of the implementation of the underfilling process of FIG. 2 according to some embodiments. With respect to any given underfilling process, the term "underfill region" may be used to collectively denote any space on the surface of the substrate—other than that beneath the element to be underfilled—that ultimately becomes coated with underfill material in conjunction with that underfill process. Thus, underfill region 414 may be representative of the space on the surface of substrate 104—other than that beneath element 102—that becomes coated with underfill material 210 in conjunction with the underfilling process of FIG. 2. As reflected in FIG. 4, in various embodiments, according to the underfilling process of FIG. 2, outwardly-flowing underfill material 210 may reach regions of the surface of substrate 104 that are significantly distant from element 102.

Figure 5:
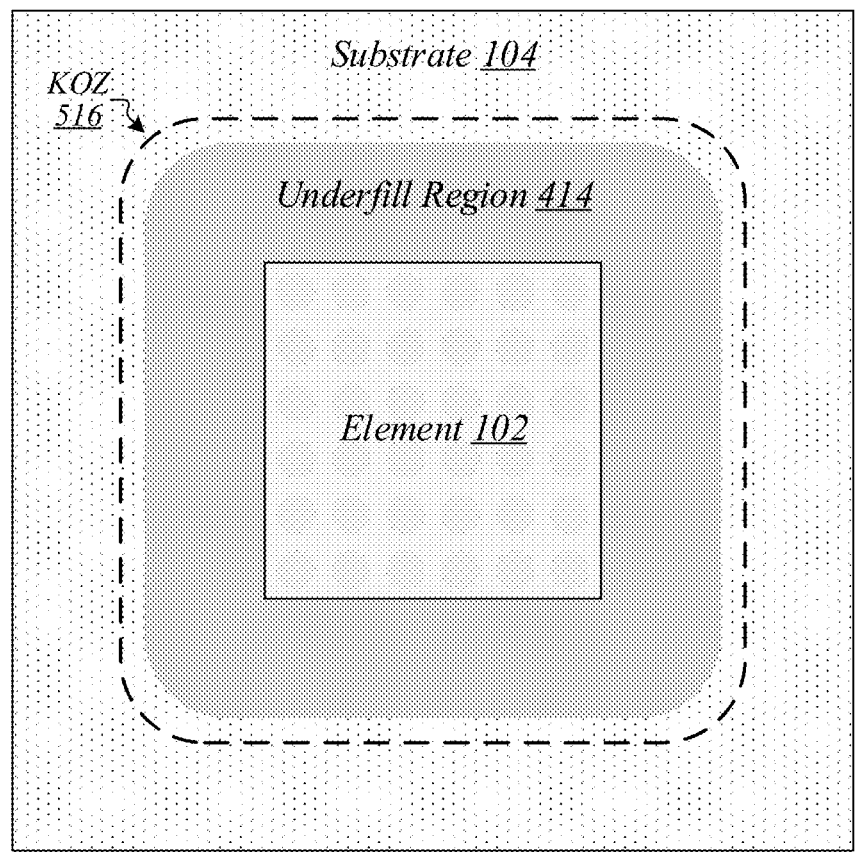
FIG. 5 illustrates an embodiment of a first keep-out zone.

In some embodiments, for any of a variety of possible reasons, it may not be desirable to mount or otherwise incorporate other elements on regions of the surface of substrate 104 that are (or will become) coated with underfill material. As such, in various embodiments, a design for electronic assembly 100 may define a keep-out zone to accommodate an underfill region such as underfill region 414. In such embodiments, the keep-out zone may generally comprise a defined region within which elements are not to be mounted or otherwise incorporated upon the surface of substrate 104. In some embodiments, a keep-out zone that is defined for a given underfilling process may be slightly larger than the expected underfill region with respect to that underfilling process, in order to provide a margin for error FIG. 5 illustrates an example of a keep-out zone (KOZ) 516 that may be defined to accommodate underfill region 414 according to various embodiments. In some embodiments, as reflected by the example of FIG. 5, the amount of surface area that must be reserved as a keep-out zone in conjunction with forming an underfill for element 102 according to the underfilling process of FIG. 2 may be significant, and may even exceed the amount of surface area occupied by element 102 in some cases.

Disclosed herein are space-efficient underfilling techniques that may be implemented in various embodiments in order to form an underfill for an electronic element in a manner that consumes less surface area relative to an underfilling process such as that of FIG. 2. According to some such techniques, an underfilling process may be designed such that the outward flow of dispensed underfill material is inhibited in order to reduce the size of the underfill region that results from that underfilling process. In various embodiments, the use of such an underfilling process may enable a reduction in the size of a keep-out zone for the electronic element. The embodiments are not limited in this context.

Figure 6:
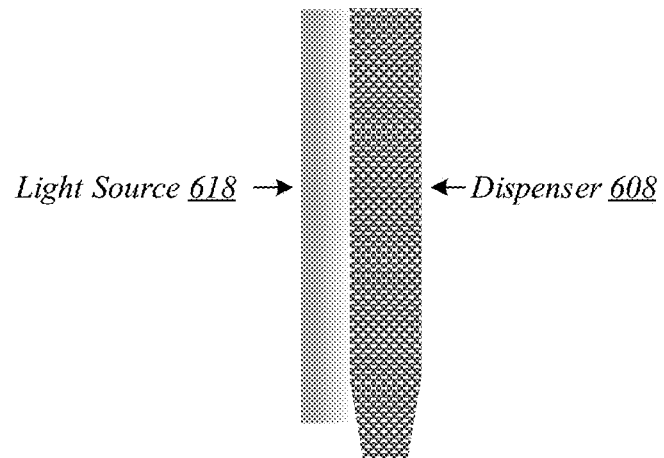
FIG. 6 illustrates an embodiment of a dispense assembly.

FIG. 6 illustrates an embodiment of a dispense assembly 600 that may be used to implement one or more of the disclosed space-efficient underfilling techniques according to some embodiments. As shown in FIG. 6, dispense assembly may comprise a dispenser 608 coupled with a light source 618. Dispenser 608 may generally be configured to dispense an underfill material. In various embodiments, dispenser 608 may be configured to dispense an underfill material that can be cured using non-visible-light (NVL), and light source 618 may be configured to emit non-visible light of a nature appropriate for curing underfill material dispensed by dispenser 608. As employed herein, the term "non-visible-light" denotes electromagnetic radiation of wavelengths substantially residing outside of the range of wavelengths typically visible to the human eye. As employed herein to describe a given material, the term "NVL-curable" denotes that the described material can be cured using non-visible-light.

In some embodiments, dispenser 608 may be configured to dispense an NVL-curable underfill material that can be cured using ultraviolet (UV) light (a "UV-curable" underfill material), and light source 618 may be configured to emit UV light of the nature required to cure that UV-curable underfill material. In various embodiments, dispenser 608 may be configured to dispense an NVL-curable underfill material that can be cured using infrared (IR) light (an "IR-curable" underfill material), and light source 618 may be configured to emit IR light of the nature required to cure that IR-curable underfill material. The embodiments are not limited to these examples.

Figure 7:
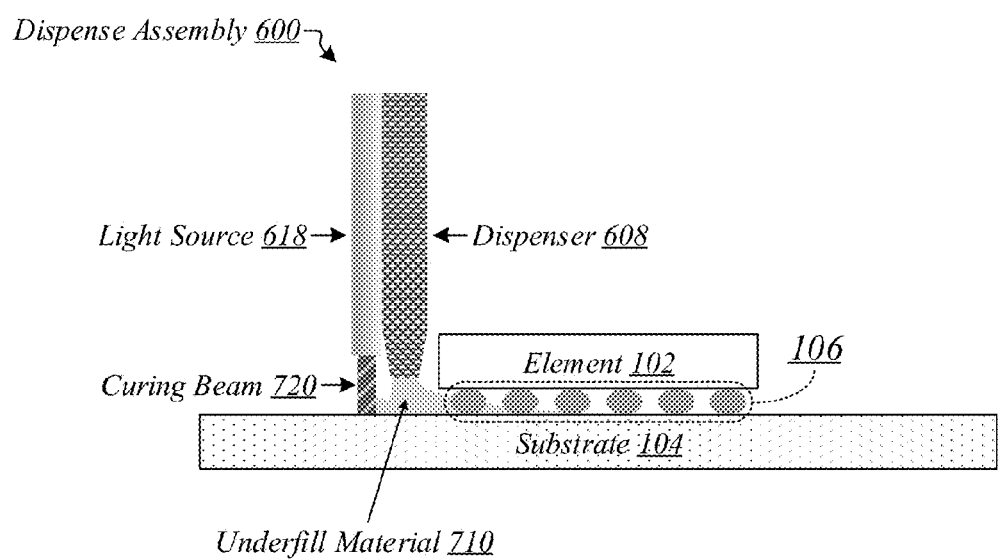
FIG. 7 illustrates an embodiment of a second underfilling process.

FIG. 7 illustrates an embodiment of an underfilling process that may be representative of the implementation of one or more of the disclosed space-efficient underfilling techniques according to some embodiments. In various embodiments, according to the underfilling process of FIG. 7, dispenser 608 may generally dispense an underfill material 710 upon the surface of substrate 104 within a dispense region for forming an underfill for element 102. In some embodiments, light source 618 may project a curing beam 720 upon at least a portion of the dispensed underfill material 710 to inhibit outward flow of dispensed underfill material 710 from the dispense region. Curing beam 720 may generally comprise light rays of a type usable to cure underfill material 710.

In various embodiments, in conjunction with being used to form an underfill for element 102, dispense assembly 600 may generally be positioned such that dispenser 608 is situated between light source 618 and element 102. In some embodiments, dispensed underfill material 710 that flows away from element 102 may quickly be cured by curing beam 720, while the flow of dispensed underfill material 710 towards element 102 may be unrestricted. In various embodiments, the curing of dispensed underfill material 710 by curing beam 720 may create a dam-like effect, according to which the outward flow of dispensed underfill material 710 may be blocked by cured underfill material 710 in its path, forcing the material to flow in the opposite direction. In some embodiments, dispense assembly 600 may be conveyed along a dispense path, such as dispense path 312 of FIG. 3. In various embodiments, dispenser 608 may dispense underfill material 710 within the dispense region by dispensing underfill material 710 as dispense assembly 600 traverses the dispense path. In some embodiments, light source 618 may project curing beam 720 upon dispensed underfill material 710 as dispense assembly 600 traverses the dispense path. The embodiments are not limited in this context.

In various embodiments, underfill material 710 may comprise an NVL-curable material, and curing rays 1020 may comprise non-visible light of a nature appropriate for curing that NVL-curable material. In some embodiments, underfill material 710 may comprise a UV-curable material, and curing beam 720 may comprise UV light. In various embodiments, underfill material 710 may comprise an IR-curable material, and curing beam 720 may comprise IR light. In some embodiments, underfill material 710 may comprise an NVL-curable epoxy. For example, in various embodiments, underfill material 710 may comprise a cationic UV-curable epoxy or a free radical UV-curable epoxy. In some embodiments, underfill material 710 may comprise an NVL-curable material, such as an NVL-curable epoxy, that is also thermally curable. The embodiments are not limited in this context.

Figure 8:
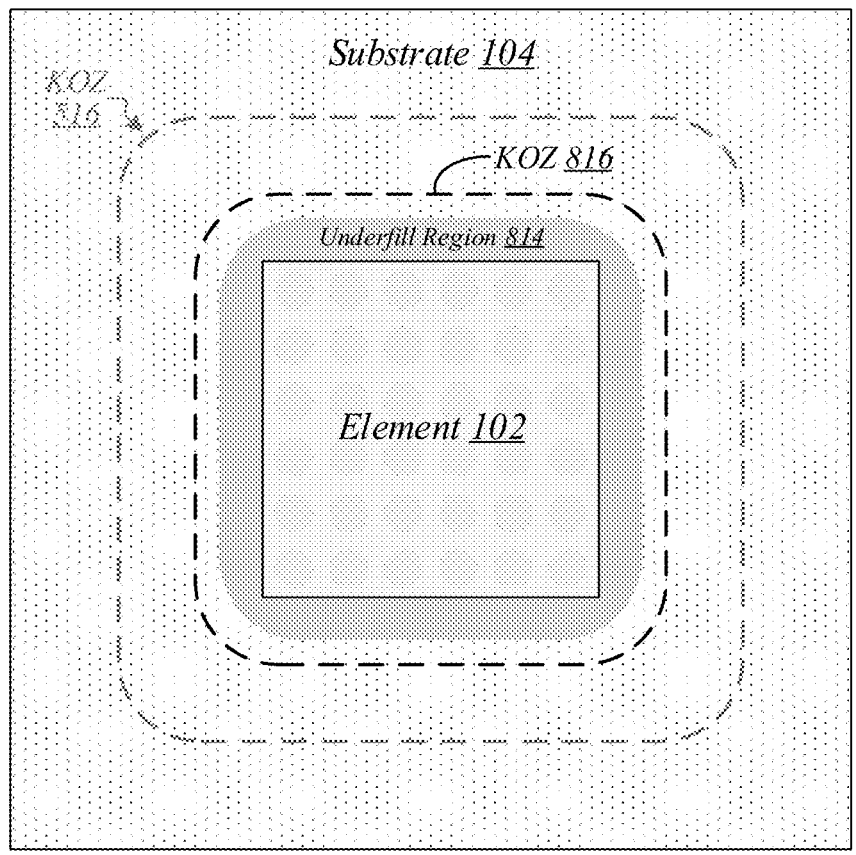
FIG. 8 illustrates an embodiment of a second underfill region and an embodiment of a second keep-out zone.

FIG. 8 illustrates an underfill region 814 that may be representative of the implementation of the underfilling process of FIG. 7 according to various embodiments. For example, underfill region 814 may be representative of an underfill region that results when an NVL-curable underfill material is dispensed by dispense assembly 600 of FIG. 6 as it traverses dispense path 312 of FIG. 3. Unlike underfill region 414 of FIG. 4, underfill region 814 only extends a small distance outward from the periphery of element 102. As such, as shown in FIG. 8, the use of the underfilling process of FIG. 7 may permit the implementation of a keep-out zone 816 that is significantly smaller than the keep-out zone 516 that may be required to accommodate underfill region 414 in conjunction with implementation of the underfilling process of FIG. 2. The embodiments are not limited to this example.

Figure 9:
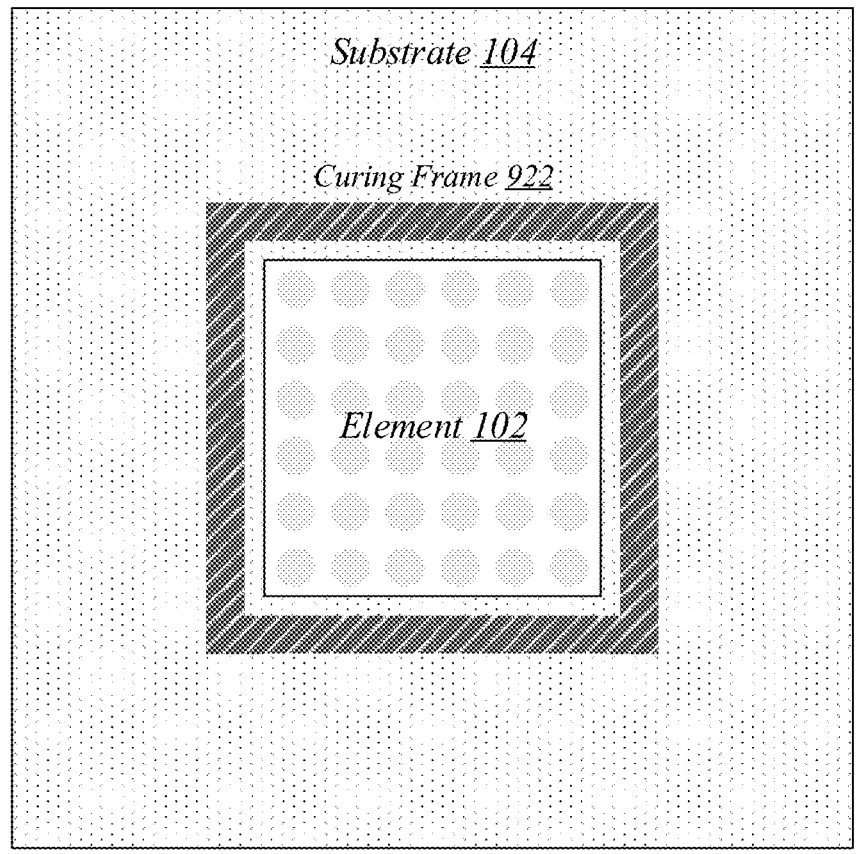
FIG. 9 illustrates an embodiment of a third underfilling process.

FIG. 9 illustrates an embodiment of another underfilling process that may be representative of the implementation of one or more of the disclosed space-efficient underfilling techniques according to some embodiments. According to the underfilling process of FIG. 9, rather than being projected by a light source that moves in tandem with the dispenser that dispenses the underfill material, the curing rays may be continuously projected upon a static curing region that surrounds the dispense region. For example, curing rays may be projected upon the curing region in the form of curing frame 922. Although curing frame 922 is depicted in this example as being square in shape, other shapes are both possible and contemplated, and the embodiments are not limited to this example. In various embodiments, portions of underfill material that flow away from element 102 and are cured by curing frame 922 may essentially act as an o-ring, seal, dam, or other type of obstacle that prevents or inhibits flow of underfill material away from element 102. According to some embodiments, the underfilling process of FIG. 9 may be well-suited for use in forming an underfill for a semiconductor die, and/or in situations requiring glob top control or dam and fill applications, such as wirebond protection applications. According to various embodiments, in the latter case, an exposure LED pattern may be projected around the underfill material dispenser. The embodiments are not limited to this example.

Figure 10A:
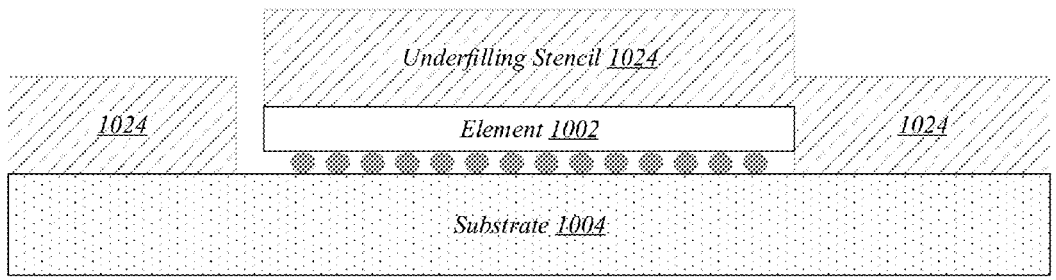
FIG. 10A illustrates an embodiment of a first stage of a fourth underfilling process.
Figure 10B:
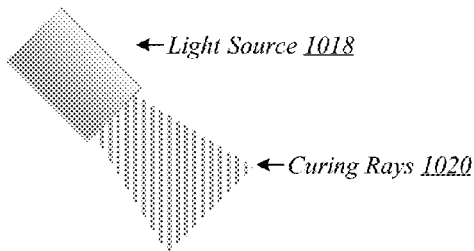
FIG. 10B illustrates an embodiment of a second stage of the fourth underfilling process.
Figure 10B:
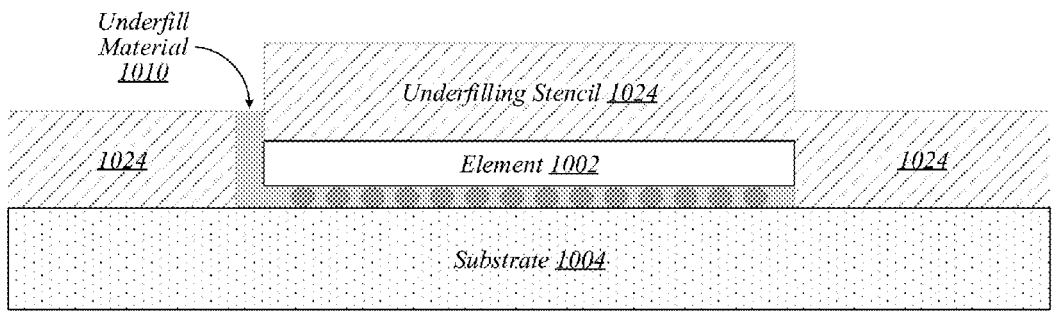

FIGS. 10A and 10B illustrate first and second stages of another underfilling process that may be representative of the implementation of one or more of the disclosed space-efficient underfilling techniques according to some embodiments. As reflected in FIG. 10A, the first stage may involve forming an underfilling stencil 1024 for an element 1002 mounted on a surface of a substrate 1004. In various embodiments, underfilling stencil 1024 may be formed by deposition of a stencil material. In some embodiments, element 102 may generally comprise an electronic element. In various embodiments, element 102 may comprise a silicon die, or another type of semiconductor die. In some embodiments, element 102 may comprise one or more integrated circuits (ICs). In various embodiments, such IC(s)

may comprise processing circuitry. In some embodiments, such IC(s) may comprise radio frequency (RF) transceiver circuitry. In various embodiments, substrate 104 may comprise a printed circuit board (PCB). The embodiments are not limited to these examples.

As reflected in FIG. 10B, the second stage may involve dispensing underfill material 1010 to form an underfill for element 1002. In some embodiments, underfill material 1010 may be dispensed through one or more openings of underfilling stencil 1024. In various embodiments, a light source 1018 may be used to project curing rays 1020 in order to cure at least a portion of the dispensed underfilling material 1010. In some embodiments, at least a portion of curing rays 1020 may at least partially permeate underfilling stencil 1024 in conjunction with curing the underfill material 1010. In various embodiments, curing rays 1020 may be projected for an amount of time sufficient to cause some or all of the dispensed underfill material 1010 to hold its shape, and underfilling stencil 1024 may then be removed. In some embodiments, the underfilling process of FIGS. 10A and 10B may be well-suited for use in strip level applications, and/or system in package (SiP) applications in which the dispensing of underfill material may tend to be time consuming. The embodiments are not limited in this context.

In various embodiments, underfill material 1010 may comprise an NVL-curable material, and curing rays 1020 may comprise non-visible light of a nature appropriate for curing that NVL-curable material. In some embodiments, underfill material 1010 may comprise a UV-curable material, and curing rays 1020 may comprise UV light. In various embodiments, underfill material 1010 may comprise an IR-curable material, and curing rays 1020 may comprise IR light. In some embodiments, underfill material 1010 may comprise an NVL-curable epoxy. For example, in various embodiments, underfill material 1010 may comprise a cationic UV-curable epoxy or a free radical UV-curable epoxy. In some embodiments, underfill material 1010 may comprise an NVL-curable material, such as an NVL-curable epoxy, that is also thermally curable. The embodiments are not limited in this context.

Figure 11:
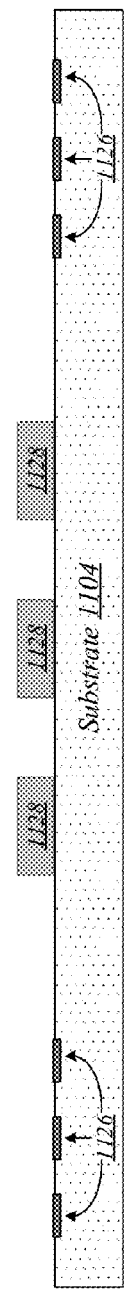
FIG. 11 illustrates an embodiment of a second electronic assembly.

FIG. 11 illustrates a lateral view of an electronic assembly 1100. As shown in FIG. 11, electronic assembly 1100 comprises a substrate 1104, as well as a plurality of elements 1126 and 1128 that are embedded in and/or mounted on that substrate 1104. In various embodiments, elements 1128 may comprise electronic components/packages that are mounted on substrate 1104. In some embodiments, elements 1126 may comprise conductive features, such as traces, tracks, vias, pads, lands, leads, and planes. The embodiments are not limited in this context.

Figure 12A:
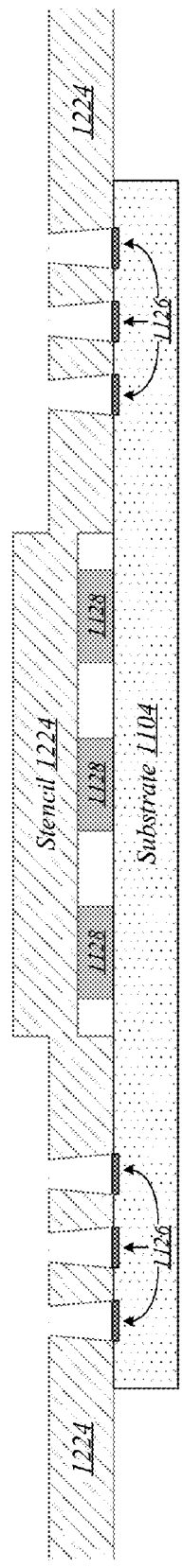
FIG. 12A illustrates an embodiment of a first stage of a feature formation process.

FIGS. 12A, 12B, and 12C illustrate first, second, and third stages of a feature formation process that may be representative of the implementation of one or more techniques disclosed herein. As reflected in FIG. 12A, the first stage of the feature formation process may involve forming a stencil 1224. In various embodiments, stencil 1224 may be formed by deposition of a stencil material. As reflected in FIG. 12B, the second stage of the feature formation process may involve dispensing a material 1210 in order to form features upon elements 1126. In some embodiments, material 1210 may be dispensed through openings of stencil 1224 that generally coincide with the locations of elements 1126. In various embodiments, a light source 1218 may be used to project curing rays 1220 in order to cure at least a portion of the dispensed material 1210. In some embodiments, at least a portion of curing rays 1220 may at least partially permeate stencil 1224 in conjunction with curing the material 1210. In various embodiments, curing rays 1220 may be projected for an amount of time sufficient to cause the dispensed material 1210 to hold its shape. In some embodiments, the third stage of the feature formation process may involve removing stencil 1224. In various embodiments, as reflected in FIG. 12C, the curing of the dispensed material 1210 during the second phase may cause the dispensed material 1210 to harden and form features 1230 that hold their shape once stencil 1224 is removed. The embodiments are not limited in this context.

In various embodiments, material 1210 may comprise an NVL-curable material, and curing rays 1220 may comprise non-visible light of a nature appropriate for curing that NVL-curable material. In some embodiments, material 1210 may comprise a UV-curable material, and curing rays 1220 may comprise UV light. In various embodiments, material 1210 may comprise an IR-curable material, and curing rays 1220 may comprise IR light. In some embodiments, material 1210 may comprise an NVL-curable epoxy. For example, in various embodiments, material 1210 may comprise a cationic UV-curable epoxy or a free radical UV-curable epoxy. In some embodiments, material 1210 may comprise an NVL-curable material, such as an NVL-curable epoxy, that is also thermally curable. The embodiments are not limited in this context.

Operations for the above embodiments may be further described with reference to the following figures and accompanying examples. Some of the figures may include a process flow. Although such figures presented herein may include a particular process flow, it can be appreciated that the process flow merely provides an example of how one or more techniques described herein may be implemented. Any particular such process flow may be implemented using one or more hardware elements, one or more software elements executed by a processor, or any combination thereof. The embodiments are not limited in this context.

Figure 13:
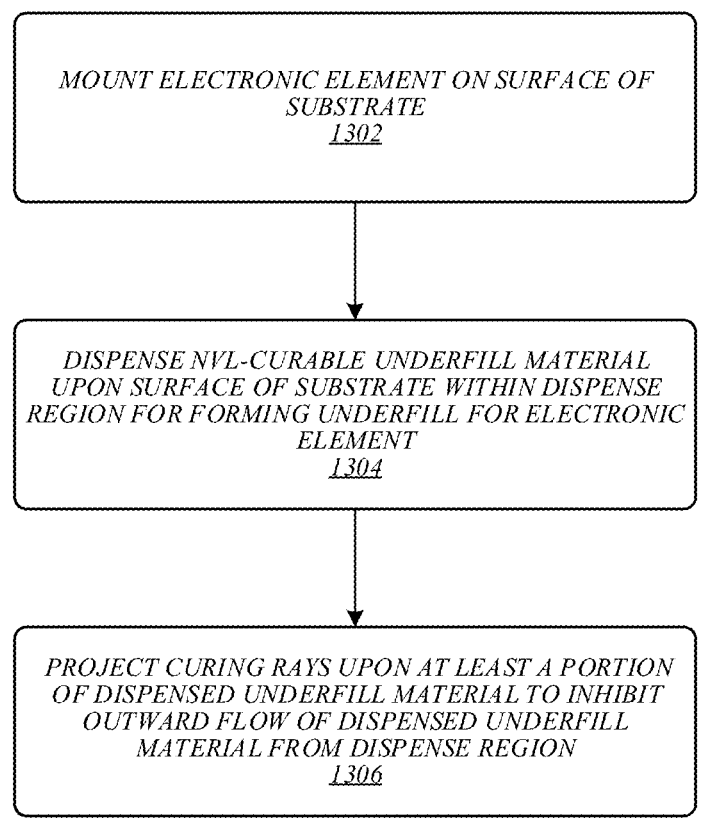
FIG. 13 illustrates an embodiment of a first process flow.

FIG. 13 illustrates an example of a process flow 1300 that may be representative of the implementation of one or more of the disclosed techniques according to some embodiments. For example, process flow 1300 may be representative of one or both of the underfilling process of FIG. 7 and the underfilling process of FIG. 9. As shown in FIG. 13, an electronic element may be mounted on a surface of a substrate at 1302. For example, element 102 may be mounted on a surface of substrate 104. At 1304, an NVL-curable underfill material may be dispensed upon the surface of the substrate within a dispense region for forming an underfill for the electronic element. For example, dispense assembly 600 of FIG. 6 may be conveyed along a dispense path, and may dispense NVL-curable underfill material upon the surface of the substrate within the dispense region as it traverses the dispense path. At 1306, curing rays may be projected upon at least a portion of the dispensed underfill material to inhibit an outward flow of dispensed underfill material from the dispense region. For example, light source 618 of FIG. 6 may project a curing beam upon dispensed underfill material as dispense assembly 600 traverses a dispense path. The embodiments are not limited to these examples.

Figure 14:
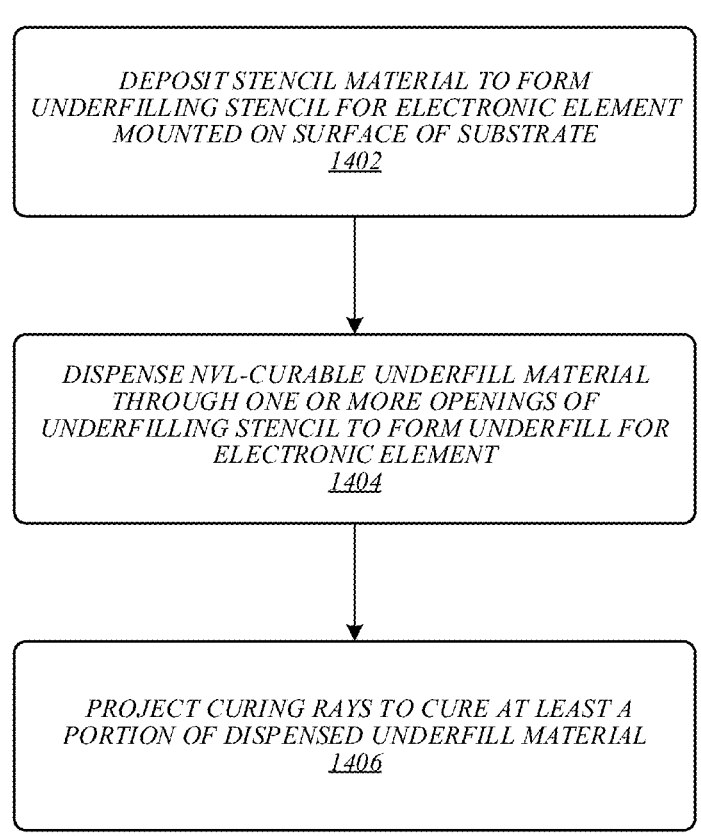
FIG. 14 illustrates an embodiment of a second process flow.

FIG. 14 illustrates an example of a process flow 1400 that may be representative of the implementation of one or more of the disclosed techniques according to various embodiments. For example, process flow 1400 may be representative of the underfilling process of FIGS. 10A and 10B. As shown in FIG. 14, stencil material may be deposited at 1402 to form an underfilling stencil for an electronic element mounted on a surface of a substrate. For example, stencil material may be deposited to form underfilling stencil 1024 of FIG. 10A. At 1404, an NVL-curable underfill material may be dispensed through one or more openings of the underfilling stencil to form an underfill for the electronic element. For example, underfill material 1010 of FIG. 10B may be dispensed through one or more openings of underfilling stencil 1024 to form an underfill for element 1002. At 1406, curing rays may be projected to cure at least a portion of the disposed underfill material. For example, light source 1018 of FIG. 10B may project curing rays 1020 to cure at least a portion of the underfill material 1010 dispensed in order to form the underfill for element 1002. The embodiments are not limited to these examples.

It is worthy of note that although the preceding discussion has been directed to example embodiments in which an NVL-curable underfill material is used, the embodiments are not so limited. Any light-curable underfill material may potentially be used in conjunction with implementation of one or more of the disclosed techniques according to various embodiments. As employed herein to describe a given material, the term "light-curable" denotes that the material can be cured using electromagnetic radiation of some kind, which may or may not comprise non-visible light. In some embodiments, a light-curable underfill material may be dispensed and cured according to one or more of the disclosed techniques. In various embodiments, the light-curable underfill material may comprise an NVL-curable material, such as a UV-curable material or an IR-curable material, that is cured using non-visible light. In some other embodiments, the light-curable underfill material may comprise a visible light (VL)-curable material that is cured using visible light. In various embodiments, it may be possible to cure the light-curable underfill material both by using non-visible light and by using visible light. In some embodiments, a combination of non-visible light and visible light may be used to cure the light-curable underfill material. The embodiments are not limited in this context.

Figure 15:
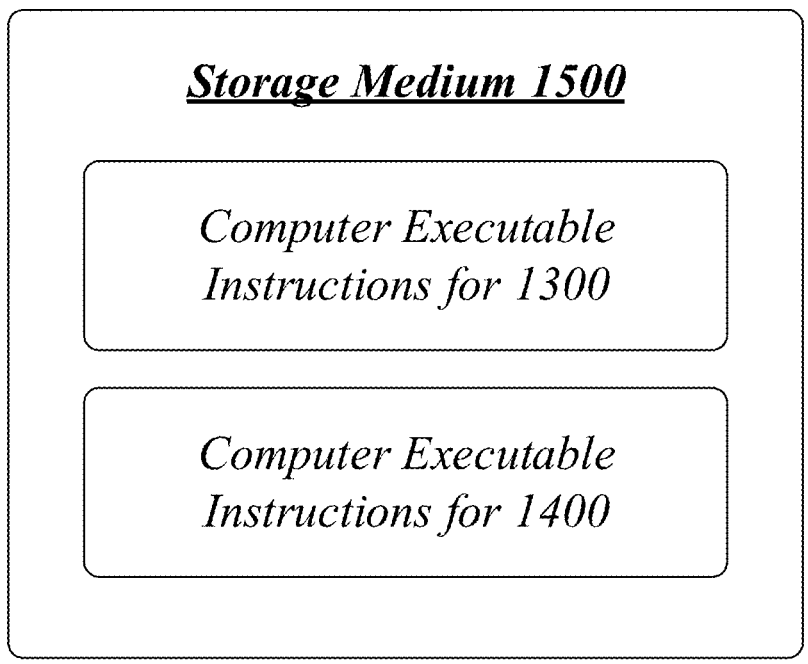
FIG. 15 illustrates an embodiment of a storage medium.

FIG. 15 illustrates an embodiment of a storage medium 1500. Storage medium 1500 may comprise any computer-readable storage medium or machine-readable storage medium, such as an optical, magnetic or semiconductor storage medium. In various embodiments, storage medium 1500 may comprise an article of manufacture. In some embodiments, storage medium 1500 may comprise a non-transitory storage medium. In some embodiments, storage medium 1500 may store computer-executable instructions, such as computer-executable instructions to implement one or both of process flow 1300 of FIG. 13 and process flow 1400 of FIG. 14. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable type of code, such as source code, compiled code, interpreted code, executable code, static code, dynamic code, object-oriented code, visual code, and the like. The embodiments are not limited in this context.

Figure 16:
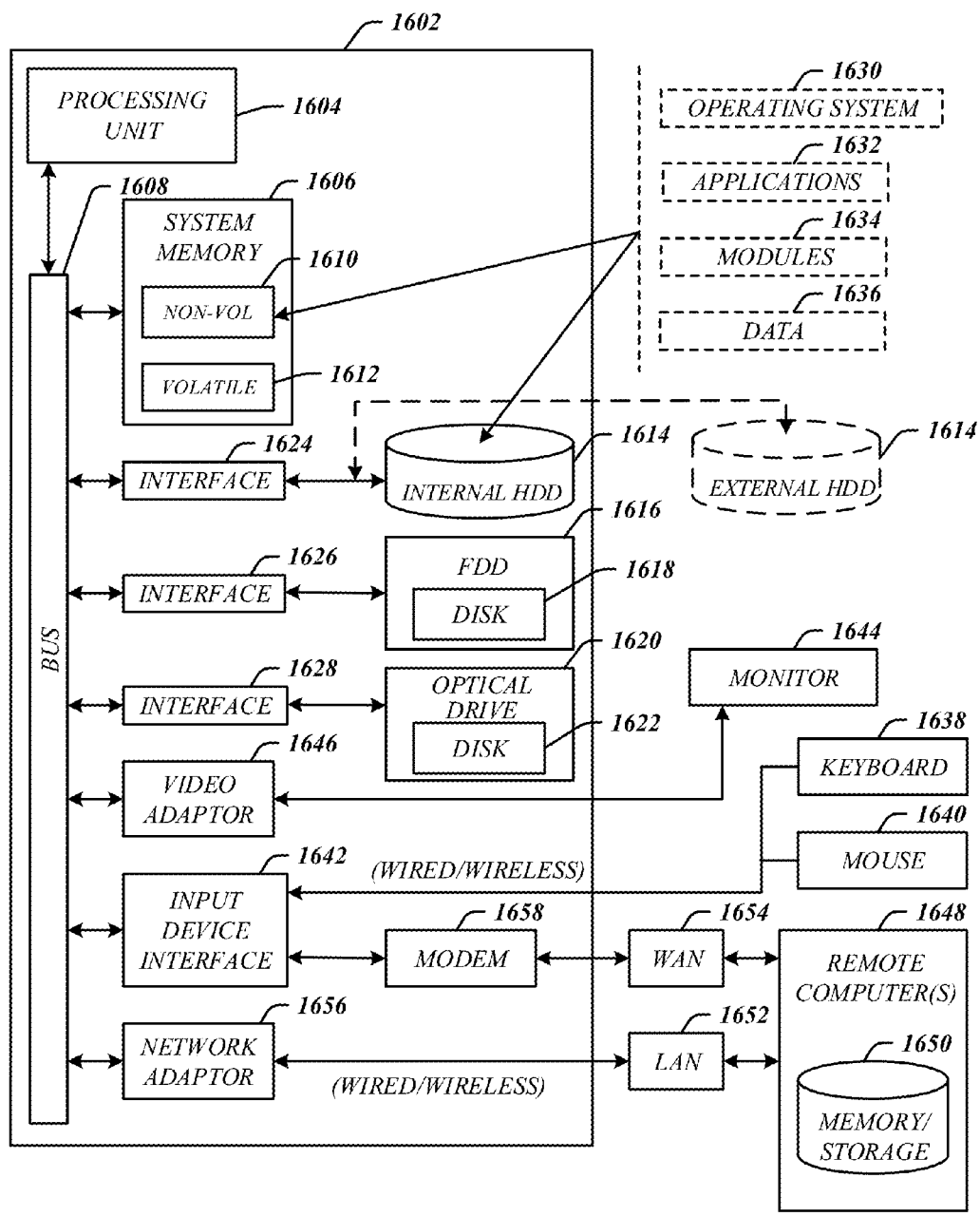
FIG. 16 illustrates an embodiment of a computing architecture.

FIG. 16 illustrates an embodiment of an exemplary computing architecture 1600 that may be suitable for implementing various embodiments as previously described. In various embodiments, the computing architecture 1600 may comprise or be implemented as part of an electronic device. In some embodiments, the computing architecture 1600 may be representative of a computing device that comprises a structure featuring an electronic assembly constructed to one or more of the disclosed techniques, such as one or more of the underfilling process of FIG. 7, the underfilling process of FIG. 9, the underfilling process of FIGS. 10A and 10B, the feature formation process of FIGS. 12A, 12B, and 12C, process flow 1300 of FIG. 13, and process flow 1400 of FIG. 14. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1600. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1600 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1600.

As shown in FIG. 16, according to computing architecture 1600, a computer 1602 comprises a processing unit 1604, a system memory 1606 and a system bus 1608. In some embodiments, computer 1602 may comprise a server. In some embodiments, computer 1602 may comprise a client. The processing unit 1604 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 1604.

The system bus 1608 provides an interface for system components including, but not limited to, the system memory 1606 to the processing unit 1604. The system bus 1608 can be any of several types of bus structure that may further interconnect to a memory bus (with or without a memory controller), a peripheral bus, and a local bus using any of a variety of commercially available bus architectures. Interface adapters may connect to the system bus 1608 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1606 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 16, the system memory 1606 can include non-volatile memory 1610 and/or volatile memory 1612. A basic input/output system (BIOS) can be stored in the non-volatile memory 1610.

The computer 1602 may include various types of computer-readable storage media in the form of one or more lower speed memory units, including an internal (or external) hard disk drive (HDD) 1614, a magnetic floppy disk drive (FDD) 1616 to read from or write to a removable magnetic disk 1618, and an optical disk drive 1620 to read from or write to a removable optical disk 1622 (e.g., a CD-ROM or DVD). The HDD 1614, FDD 1616 and optical disk drive 1620 can be connected to the system bus 1608 by a HDD interface 1624, an FDD interface 1626 and an optical drive interface 1628, respectively. The HDD interface 1624 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 1610, 1612, including an operating system 1630, one or more application programs 1632, other program modules 1634, and program data 1636.

A user can enter commands and information into the computer 1602 through one or more wire/wireless input devices, for example, a keyboard 1638 and a pointing device, such as a mouse 1640. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1604 through an input device interface 1642 that is coupled to the system bus 1608, but can be connected by other interfaces such as a parallel port, IEEE 1394 serial port, a game port, a USB port, an IR interface, and so forth.

A monitor 1644 or other type of display device is also connected to the system bus 1608 via an interface, such as a video adaptor 1646. The monitor 1644 may be internal or external to the computer 1602. In addition to the monitor 1644, a computer typically includes other peripheral output devices, such as speakers, printers, and so forth.

The computer 1602 may operate in a networked environment using logical connections via wire and/or wireless communications to one or more remote computers, such as a remote computer 1648. The remote computer 1648 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory/storage device 1650 is illustrated. The logical connections depicted include wire/wireless connectivity to a local area network (LAN) 1652 and/or larger networks, for example, a wide area network (WAN) 1654. Such LAN and WAN networking environments are commonplace in offices and companies, and facilitate enterprise-wide computer networks, such as intranets, all of which may connect to a global communications network, for example, the Internet.

When used in a LAN networking environment, the computer 1602 is connected to the LAN 1652 through a wire and/or wireless communication network interface or adaptor 1656. The adaptor 1656 can facilitate wire and/or wireless communications to the LAN 1652, which may also include a wireless access point disposed thereon for communicating with the wireless functionality of the adaptor 1656.

When used in a WAN networking environment, the computer 1602 can include a modem 1658, or is connected to a communications server on the WAN 1654, or has other means for establishing communications over the WAN 1654, such as by way of the Internet. The modem 1658, which can be internal or external and a wire and/or wireless device, connects to the system bus 1608 via the input device interface 1642. In a networked environment, program modules depicted relative to the computer 1602, or portions thereof, can be stored in the remote memory/storage device 1650. It will be appreciated that the network connections shown are exemplary and other means of establishing a communications link between the computers can be used.

The computer 1602 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Figure 17:
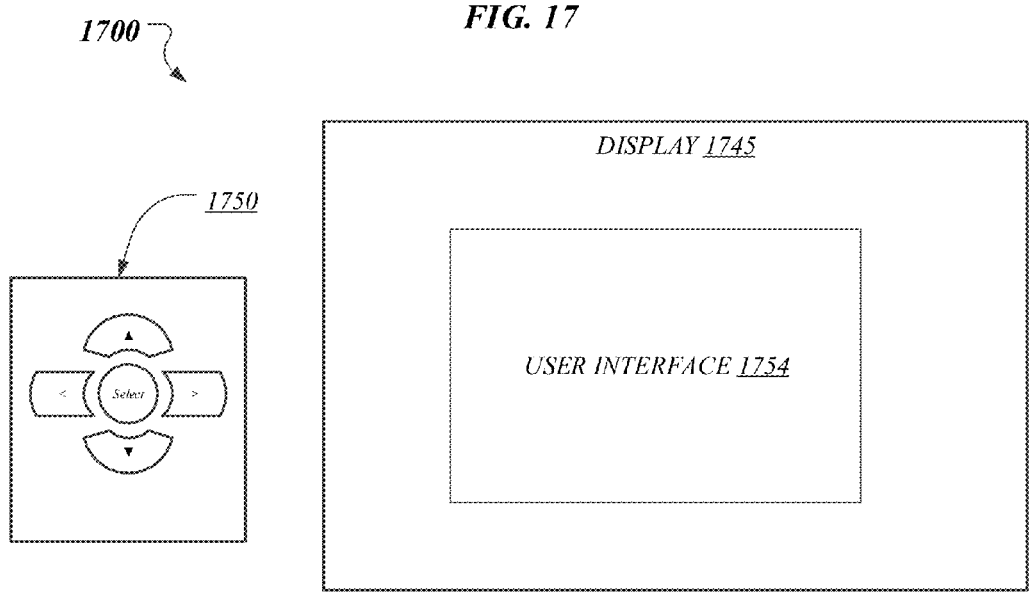
FIG. 17 illustrates an embodiment of a system.
Figure 17:
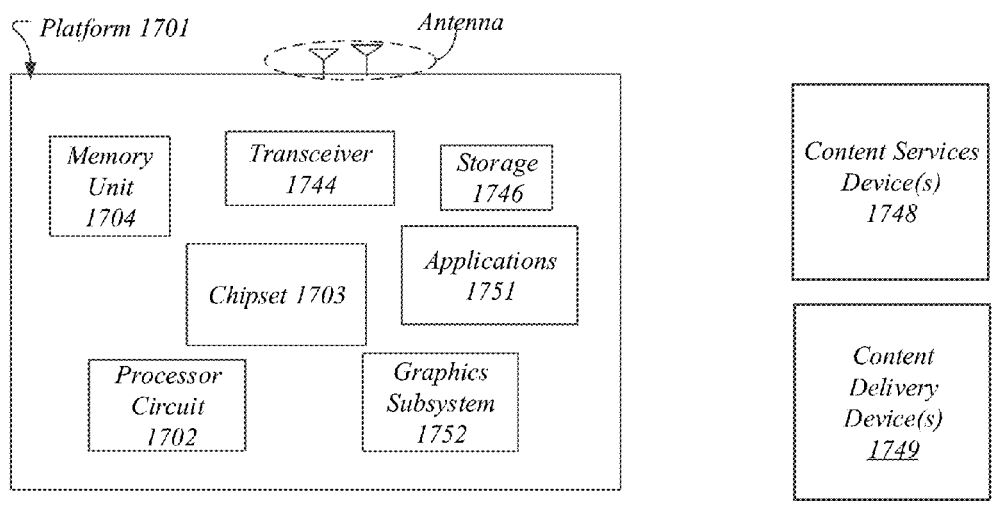
Figure 17:

FIG. 17 illustrates an embodiment of a system 1700. In various embodiments, system 1700 may be representative of a system or architecture that is realized according to one or more techniques described herein, such as one or more of the underfilling process of FIG. 7, the underfilling process of FIG. 9, the underfilling process of FIGS. 10A and 10B, the feature formation process of FIGS. 12A, 12B, and 12C, process flow 1300 of FIG. 13, process flow 1400 of FIG. 14, storage medium 1500 of FIG. 15, and computing architecture 1600 of FIG. 16. The embodiments are not limited in this respect.

As shown in FIG. 17, system 1700 may include multiple elements. One or more elements may be implemented using one or more circuits, components, registers, processors, software subroutines, modules, or any combination thereof, as desired for a given set of design or performance constraints. Although FIG. 17 shows a limited number of elements in a certain topology by way of example, it can be appreciated that more or less elements in any suitable topology may be used in system 1700 as desired for a given implementation. The embodiments are not limited in this context.

In embodiments, system 1700 may be a media system although system 1700 is not limited to this context. For example, system 1700 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 1700 includes a platform 1701 coupled to a display 1745. Platform 1701 may receive content from a content device such as content services device(s) 1748 or content delivery device(s) 1749 or other similar content sources. A navigation controller 1750 including one or more navigation features may be used to interact with, for example, platform 1701 and/or display 1745. Each of these components is described in more detail below.

In embodiments, platform 1701 may include any combination of a processor circuit 1702, chipset 1703, memory unit 1704, transceiver 1744, storage 1746, applications 1751, and/or graphics subsystem 1752. Chipset 1703 may provide intercommunication among processor circuit 1702, memory unit 1704, transceiver 1744, storage 1746, applications 1751, and/or graphics subsystem 1752. For example, chipset 1703 may include a storage adapter (not depicted) capable of providing intercommunication with storage 1746.

Processor circuit 1702 may be implemented using any processor or logic device, and may be the same as or similar to processing unit 1604 of FIG. 16. Memory unit 1704 may be implemented using any machine-readable or computer-readable media capable of storing data, and may be the same as or similar to system memory 1606 of FIG. 16. Transceiver 1744 may include one or more radios capable of transmitting and receiving signals using various suitable wireless communications techniques. Display 1745 may include any television type monitor or display, and may be the same as or similar to monitor 1644 of FIG. 16. Storage 1746 may be implemented as a non-volatile storage device, and may be the same as or similar to HDD 1614 of FIG. 16.

Graphics subsystem 1752 may perform processing of images such as still or video for display. Graphics subsystem 1752 may be a graphics processing unit (GPU) or a visual processing unit (VPU), for example. An analog or digital interface may be used to communicatively couple graphics subsystem 1752 and display 1745. For example, the interface may be any of a High-Definition Multimedia Interface, DisplayPort, wireless HDMI, and/or wireless HD compliant techniques. Graphics subsystem 1752 could be integrated into processor circuit 1702 or chipset 1703. Graphics subsystem 1752 could be a stand-alone card communicatively coupled to chipset 1703.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

In embodiments, content services device(s) 1748 may be hosted by any national, international and/or independent service and thus accessible to platform 1701 via the Internet, for example. Content services device(s) 1748 may be coupled to platform 1701 and/or to display 1745. Platform 1701 and/or content services device(s) 1748 may be coupled to a network 1753 to communicate (e.g., send and/or receive) media information to and from network 1753. Content delivery device(s) 1749 also may be coupled to platform 1701 and/or to display 1745.

In embodiments, content services device(s) 1748 may include a cable television box, personal computer, network, telephone, Internet enabled devices or appliance capable of delivering digital information and/or content, and any other similar device capable of unidirectionally or bidirectionally communicating content between content providers and platform 1701 and/display 1745, via network 1753 or directly. It will be appreciated that the content may be communicated unidirectionally and/or bidirectionally to and from any one of the components in system 1700 and a content provider via network 1753. Examples of content may include any media information including, for example, video, music, medical and gaming information, and so forth.

Content services device(s) 1748 receives content such as cable television programming including media information, digital information, and/or other content. Examples of content providers may include any cable or satellite television or radio or Internet content providers. The provided examples are not meant to limit embodiments of the disclosed subject matter.

In embodiments, platform 1701 may receive control signals from navigation controller 1750 having one or more navigation features. The navigation features of navigation controller 1750 may be used to interact with a user interface 1754, for example. In embodiments, navigation controller 1750 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of navigation controller 1750 may be echoed on a display (e.g., display 1745) by movements of a pointer, cursor, focus ring, or other visual indicators displayed on the display. For example, under the control of software applications 1751, the navigation features located on navigation controller 1750 may be mapped to virtual navigation features displayed on user interface 1754. In embodiments, navigation controller 1750 may not be a separate component but integrated into platform 1701 and/or display 1745. Embodiments, however, are not limited to the elements or in the context shown or described herein.

In embodiments, drivers (not shown) may include technology to enable users to instantly turn on and off platform 1701 like a television with the touch of a button after initial boot-up, when enabled, for example. Program logic may allow platform 1701 to stream content to media adaptors or other content services device(s) 1748 or content delivery device(s) 1749 when the platform is turned "off." In addition, chip set 1703 may include hardware and/or software support for 5.1 surround sound audio and/or high definition 7.1 surround sound audio, for example. Drivers may include a graphics driver for integrated graphics platforms. In embodiments, the graphics driver may include a peripheral component interconnect (PCI) Express graphics card.

In various embodiments, any one or more of the components shown in system 1700 may be integrated. For example, platform 1701 and content services device(s) 1748 may be integrated, or platform 1701 and content delivery device(s) 1749 may be integrated, or platform 1701, content services device(s) 1748, and content delivery device(s) 1749 may be integrated, for example. In various embodiments, platform 1701 and display 1745 may be an integrated unit. Display 1745 and content service device(s) 1748 may be integrated, or display 1745 and content delivery device(s) 1749 may be integrated, for example. These examples are not meant to limit the disclosed subject matter.

In various embodiments, system 1700 may be implemented as a wireless system, a wired system, or a combination of both. When implemented as a wireless system, system 1700 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 1700 may include components and interfaces suitable for communicating over wired communications media, such as I/O adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 1701 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 17.

Figure 18:
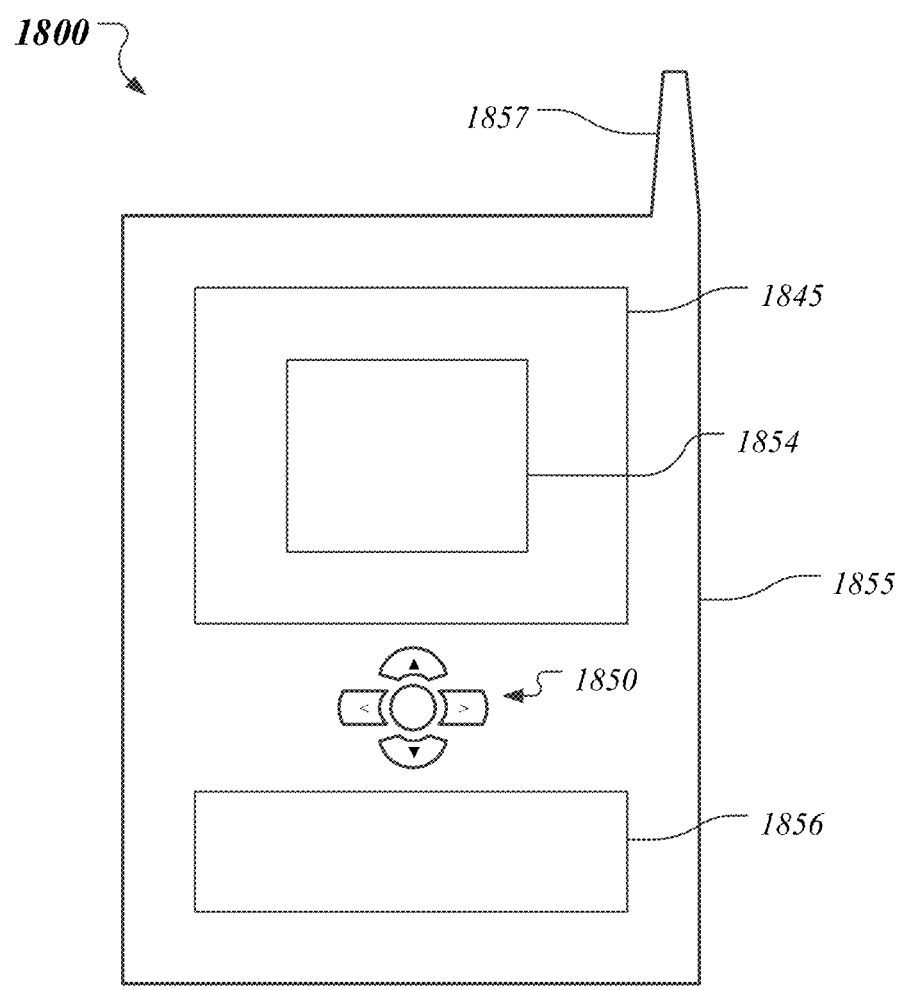
FIG. 18 illustrates an embodiment of a device.

As described above, system 1700 may be embodied in varying physical styles or form factors. FIG. 18 illustrates embodiments of a small form factor device 1800 in which system 1700 may be embodied. In embodiments, for example, device 1800 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 18, device 1800 may include a display 1845, a navigation controller 1850, a user interface 1854, a housing 1855, an I/O device 1856, and an antenna 1857. Display 1845 may include any suitable display unit for displaying information appropriate for a mobile computing device, and may be the same as or similar to display 1745 in FIG. 17. Navigation controller 1850 may include one or more navigation features which may be used to interact with user interface 1854, and may be the same as or similar to navigation controller 1750 in FIG. 17. I/O device 1856 may include any suitable I/O device for entering information into a mobile computing device. Examples for I/O device 1856 may include an alphanumeric keyboard, a numeric keypad, a touch pad, input keys, buttons, switches, rocker switches, microphones, speakers, voice recognition device and software, and so forth. Information also may be entered into device 1800 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments:

Example 1 is a method, comprising mounting an electronic element on a surface of a substrate, dispensing an underfill material upon the surface of the substrate within a dispense region for forming an underfill for the electronic element, the underfill material to comprise a non-visible light (NVL)-curable material, and projecting curing rays upon at least a portion of the dispensed underfill material to inhibit an outward flow of dispensed underfill material from the dispense region.

Example 2 is the method of Example 1, the curing rays to comprise ultraviolet (UV) light.

Example 3 is the method of Example 1, the curing rays to comprise infrared (IR) light.

Example 4 is the method of any of Examples 1 to 3, comprising conveying a dispense assembly along a dispense path to dispense the underfill material within the dispense region.

Example 5 is the method of Example 4, the dispense assembly to comprise a light source, the light source to project a curing beam upon dispensed underfill material as the dispense assembly traverses the dispense path.

Example 6 is the method of any of Examples 1 to 3, comprising projecting a curing frame upon a curing region surrounding the dispense region.

Example 7 is the method of any of Examples 1 to 6, the electronic element to comprise a semiconductor die.

Example 8 is the method of Example 7, the semiconductor die to comprise one or more integrated circuits (ICs).

Example 9 is the method of Example 8, the one or more ICs to comprise processing circuitry.

Example 10 is the method of any of Examples 8 to 9, the one or more ICs to comprise radio frequency (RF) transceiver circuitry.

Example 11 is the method of any of Examples 1 to 10, the substrate to comprise a printed circuit board (PCB).

Example 12 is the method of any of Examples 1 to 11, the underfill material to comprise an NVL-curable epoxy.

Example 13 is the method of Example 12, the NVL-curable epoxy to comprise a cationic ultraviolet (UV)-curable epoxy or a free radical UV-curable epoxy.

Example 14 is the method of any of Examples 12 to 13, the NVL-curable epoxy to comprise a thermally-curable epoxy.

Example 15 is an apparatus, comprising a dispenser to dispense an underfill material, the underfill material to comprise a non-visible light (NVL)-curable material selected for use to form an underfill for an electronic element mounted on a surface of a substrate, and a light source coupled to the dispenser, the light source to emit curing rays for curing underfill material dispensed by the dispenser.

Example 16 is the apparatus of Example 15, the curing rays to comprise ultraviolet (UV) light.

Example 17 is the apparatus of Example 15, the curing rays to comprise infrared (IR) light.

Example 18 is the apparatus of any of Examples 15 to 17, the electronic element to comprise a semiconductor die.

Example 19 is the apparatus of Example 18, the semiconductor die to comprise one or more integrated circuits (ICs).

Example 20 is the apparatus of Example 19, the one or more ICs to comprise processing circuitry.

Example 21 is the apparatus of any of Examples 19 to 20, the one or more ICs to comprise radio frequency (RF) transceiver circuitry.

Example 22 is the apparatus of any of Examples 15 to 21, the substrate to comprise a printed circuit board (PCB).

Example 23 is the apparatus of any of Examples 15 to 22, the underfill material to comprise an NVL-curable epoxy.

Example 24 is the apparatus of Example 23, the NVL-curable epoxy to comprise a cationic ultraviolet (UV)-curable epoxy or a free radical UV-curable epoxy.

Example 25 is the apparatus of any of Examples 23 to 24, the NVL-curable epoxy to comprise a thermally-curable epoxy.

Example 26 is a method, comprising depositing a stencil material to form an underfilling stencil for an electronic element mounted on a surface of a substrate, dispensing an underfill material through one or more openings of the underfilling stencil to form an underfill for the electronic element, the underfill material to comprise a non-visible light (NVL)-curable material, and projecting curing rays to cure at least a portion of the dispensed underfill material.

Example 27 is the method of Example 26, the curing rays to comprise ultraviolet (UV) light.

Example 28 is the method of Example 26, the curing rays to comprise infrared (IR) light.

Example 29 is the method of any of Examples 26 to 28, at least a portion of the curing rays to at least partially permeate the underfilling stencil.

Example 30 is the method of any of Examples 26 to 29, the electronic element to comprise a semiconductor die.

Example 31 is the method of Example 30, the semiconductor die to comprise one or more integrated circuits (ICs).

Example 32 is the method of Example 31, the one or more ICs to comprise processing circuitry.

Example 33 is the method of any of Examples 31 to 32, the one or more ICs to comprise radio frequency (RF) transceiver circuitry.

Example 34 is the method of any of Examples 26 to 33, the substrate to comprise a printed circuit board (PCB).

Example 35 is the method of any of Examples 26 to 34, the underfill material to comprise an NVL-curable epoxy.

Example 36 is the method of Example 35, the NVL-curable epoxy to comprise a cationic ultraviolet (UV)-curable epoxy or a free radical UV-curable epoxy.

Example 37 is the method of any of Examples 35 to 36, the NVL-curable epoxy to comprise a thermally-curable epoxy.

Example 38 is at least one non-transitory computer-readable storage medium, comprising a set of instructions that, in response to being executed by processing circuitry of an electronic device fabrication system, cause the electronic device fabrication system to mount an electronic element on a surface of a substrate, dispense an underfill material upon the surface of the substrate within a dispense region for forming an underfill for the electronic element, the underfill material to comprise a non-visible light (NVL)-curable material, and project curing rays upon at least a portion of the dispensed underfill material to inhibit an outward flow of dispensed underfill material from the dispense region.

Example 39 is the at least one non-transitory computer-readable storage medium of Example 38, the curing rays to comprise ultraviolet (UV) light.

Example 40 is the at least one non-transitory computer-readable storage medium of Example 38, the curing rays to comprise infrared (IR) light.

Example 41 is the at least one non-transitory computer-readable storage medium of any of Examples 38 to 40, comprising instructions that, in response to being executed by processing circuitry of the electronic device fabrication system, cause the electronic device fabrication system to convey a dispense assembly along a dispense path to dispense the underfill material within the dispense region.

Example 42 is the at least one non-transitory computer-readable storage medium of Example 41, the dispense assembly to comprise a light source, the light source to project a curing beam upon dispensed underfill material as the dispense assembly traverses the dispense path.

Example 43 is the at least one non-transitory computer-readable storage medium of any of Examples 38 to 40, comprising instructions that, in response to being executed by processing circuitry of the electronic device fabrication system, cause the electronic device fabrication system to project a curing frame upon a curing region surrounding the dispense region.

Example 44 is the at least one non-transitory computer-readable storage medium of any of Examples 38 to 43, the electronic element to comprise a semiconductor die.

Example 45 is the at least one non-transitory computer-readable storage medium of Example 44, the semiconductor die to comprise one or more integrated circuits (ICs).

Example 46 is the at least one non-transitory computer-readable storage medium of Example 45, the one or more ICs to comprise processing circuitry.

Example 47 is the at least one non-transitory computer-readable storage medium of any of Examples 45 to 46, the one or more ICs to comprise radio frequency (RF) transceiver circuitry.

Example 48 is the at least one non-transitory computer-readable storage medium of any of Examples 38 to 47, the substrate to comprise a printed circuit board (PCB).

Example 49 is the at least one non-transitory computer-readable storage medium of any of Examples 1 to 48, the underfill material to comprise an NVL-curable epoxy.

Example 50 is the at least one non-transitory computer-readable storage medium of Example 49, the NVL-curable epoxy to comprise a cationic ultraviolet (UV)-curable epoxy or a free radical UV-curable epoxy.

Example 51 is the at least one non-transitory computer-readable storage medium of any of Examples 49 to 50, the NVL-curable epoxy to comprise a thermally-curable epoxy.

Example 52 is a dispense assembly, comprising means for dispensing an underfill material, the underfill material to comprise a non-visible light (NVL)-curable material selected for use to form an underfill for an electronic element mounted on a surface of a substrate, and means for emitting curing rays for curing dispensed underfill material.

Example 53 is the dispense assembly of Example 52, the curing rays to comprise ultraviolet (UV) light.

Example 54 is the dispense assembly of Example 52, the curing rays to comprise infrared (IR) light.

Example 55 is the dispense assembly of any of Examples 52 to 54, the electronic element to comprise a semiconductor die.

Example 56 is the dispense assembly of Example 55, the semiconductor die to comprise one or more integrated circuits (ICs).

Example 57 is the dispense assembly of Example 56, the one or more ICs to comprise processing circuitry.

Example 58 is the dispense assembly of any of Examples 56 to 57, the one or more ICs to comprise radio frequency (RF) transceiver circuitry.

Example 59 is the dispense assembly of any of Examples 52 to 58, the substrate to comprise a printed circuit board (PCB).

Example 60 is the dispense assembly of any of Examples 52 to 59, the underfill material to comprise an NVL-curable epoxy.

Example 61 is the dispense assembly of Example 60, the NVL-curable epoxy to comprise a cationic ultraviolet (UV)-curable epoxy or a free radical UV-curable epoxy.

Example 62 is the dispense assembly of any of Examples 60 to 61, the NVL-curable epoxy to comprise a thermally-curable epoxy.

Example 63 is at least one non-transitory computer-readable storage medium, comprising a set of instructions that, in response to being executed by processing circuitry of an electronic device fabrication system, cause the electronic device fabrication system to deposit a stencil material to form an underfilling stencil for an electronic element mounted on a surface of a substrate, dispense an underfill material through one or more openings of the underfilling stencil to form an underfill for the electronic element, the underfill material to comprise a non-visible light (NVL)-curable material, and project curing rays to cure at least a portion of the dispensed underfill material.

Example 64 is the at least one non-transitory computer-readable storage medium of Example 63, the curing rays to comprise ultraviolet (UV) light.

Example 65 is the at least one non-transitory computer-readable storage medium of Example 63, the curing rays to comprise infrared (IR) light.

Example 66 is the at least one non-transitory computer-readable storage medium of any of Examples 63 to 65, at least a portion of the curing rays to at least partially permeate the underfilling stencil.

Example 67 is the at least one non-transitory computer-readable storage medium of any of Examples 63 to 66, the electronic element to comprise a semiconductor die.

Example 68 is the at least one non-transitory computer-readable storage medium of Example 67, the semiconductor die to comprise one or more integrated circuits (ICs).

Example 69 is the at least one non-transitory computer-readable storage medium of Example 68, the one or more ICs to comprise processing circuitry.

Example 70 is the at least one non-transitory computer-readable storage medium of any of Examples 68 to 69, the one or more ICs to comprise radio frequency (RF) transceiver circuitry.

Example 71 is the at least one non-transitory computer-readable storage medium of any of Examples 63 to 70, the substrate to comprise a printed circuit board (PCB).

Example 72 is the at least one non-transitory computer-readable storage medium of any of Examples 63 to 71, the underfill material to comprise an NVL-curable epoxy.

Example 73 is the at least one non-transitory computer-readable storage medium of Example 72, the NVL-curable epoxy to comprise a cationic ultraviolet (UV)-curable epoxy or a free radical UV-curable epoxy.

Example 74 is the at least one non-transitory computer-readable storage medium of any of Examples 72 to 73, the NVL-curable epoxy to comprise a thermally-curable epoxy.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
   mounting an electronic element on a surface of a substrate;
   dispensing an underfill material upon the surface of the substrate within a dispense region for forming an underfill for the electronic element, the underfill material to comprise a non-visible light (NVL)-curable material; and
   projecting curing rays upon a portion of the dispensed underfill material to inhibit an outward flow of dispensed underfill material from the dispense region into a keep-out-zone while allowing the dispensed underfill material to flow within the dispense region.

2. The method of claim 1, the curing rays to comprise ultraviolet (UV) light.

3. The method of claim 1, the curing rays to comprise infrared (IR) light.

4. The method of claim 1, comprising conveying a dispense assembly along a dispense path to dispense the underfill material within the dispense region.

5. The method of claim 4, the dispense assembly to comprise a light source, the light source to project a curing beam upon at least a portion of the dispensed underfill material as the dispense assembly traverses the dispense path.

6. The method of claim 1, comprising projecting a curing frame upon a curing region surrounding the dispense region, the curing region to correspond to the keep-out-zone.

7. The method of claim 1, the electronic element to comprise a semiconductor die.

8. The method of claim 7, the semiconductor die to comprise one or more integrated circuits (ICs).

9. The method of claim 1, the substrate to comprise a printed circuit board (PCB).

10. The method of claim 1, the underfill material to comprise an NVL-curable epoxy.

11. A method, comprising:
   projecting curing rays onto a substrate to form a curing frame to define a dispense region within the curing frame and keep-out-zone; and
   dispensing an underfill material onto the substrate in the dispense region to form an underfill for an electronic element, the underfill material to comprise a non-visible light (NVL)-curable material, the curing rays to inhibit an outward flow of dispensed underfill material from the dispense region into the keep-out-zone while allowing the dispensed underfill material to flow within the dispense region.

12. The method of claim 11, the curing rays to comprise ultraviolet (UV) light.

13. The method of claim 11, the curing rays to comprise infrared (IR) light.

14. The method of claim 11, the electronic element to comprise a semiconductor die.

15. The method of claim 14, the semiconductor die to comprise one or more integrated circuits (ICs).

16. The method of claim 11, the substrate to comprise a printed circuit board (PCB).

17. The method of claim 11, the underfill material to comprise an NVL-curable epoxy.

* * * * *